(12) United States Patent
Cheng et al.

(10) Patent No.: US 7,005,054 B2
(45) Date of Patent: Feb. 28, 2006

(54) METHOD FOR MANUFACTURING PROBES OF A PROBE CARD

(75) Inventors: S. J. Cheng, Hsinchu (TW); An-Hong Liu, Tainan (TW); Yeong-Her Wang, Tainan (TW); Yuan-Ping Tseng, Hsinchu (TW); Y. J. Lee, Tainan (TW)

(73) Assignees: Chipmos Technologies (Bermuda) Ltd., Hamilton (BM); Chipmos Technologies Inc., Hsinchu (TW)

( * ) Notice: Subject to any disclaimer, the term of this patent is extended or adjusted under 35 U.S.C. 154(b) by 431 days.

(21) Appl. No.: 10/223,350

(22) Filed: Aug. 20, 2002

(65) Prior Publication Data

US 2004/0035706 A1 Feb. 26, 2004

(51) Int. Cl.
*C25D 5/02* (2006.01)
*C25D 5/54* (2006.01)
*C25D 5/56* (2006.01)
*H05K 3/00* (2006.01)

(52) U.S. Cl. .................. 205/118; 205/122; 205/123; 205/125; 205/129; 205/134; 205/136; 205/162; 205/164

(58) Field of Classification Search ............. 205/118, 205/122, 123, 125, 129, 134, 136, 162, 164
See application file for complete search history.

(56) References Cited

U.S. PATENT DOCUMENTS 6,036,834 A * 3/2000 Clerc ................... 205/118
2004/0065554 A1 * 4/2004 Cohen .................. 205/122

* cited by examiner

*Primary Examiner*—Edna Wong

(74) *Attorney, Agent, or Firm*—Dennison, Schultz, Dougherty & MacDonald

(57) ABSTRACT

A method to make probes of a probe card includes providing a blocking plate on an electroplating tank. The blocking plate has a plurality of openings according to the layout of contact pads on a probe head. There are bumps on the contact pads of the probe head. Continuous electroplating process can be executed after bumps (contact pads) contact electroplating solution in the electroplating tank through the openings of the blocking plate. By continuously moving the probe head according to the desired shape of probes, probes were formed by electroplating. These probes can be made into different shapes with good uniformity in elasticity and heights to increase the quality of electrical contact during wafer probing. Moreover, the process lead time and fabrication cost are saved.

6 Claims, 4 Drawing Sheets

METHOD FOR MANUFACTURING PROBES OF A PROBE CARD

FIELD OF THE INVENTION

The present invention relates to a method for manufacturing probes of a probe card and, more particularly, to a method for manufacturing probes with random yet identical formation.

BACKGROUND OF THE INVENTION

A method for fabricating probes on a probe head is disclosed in the U.S. Pat. No. 5,513,430 entitled "METHOD FOR MANUFACTURING A PROBE", as shown in FIG. 1. The probe head 10 comprises a substrate 11 having an upper surface 12 and a lower surface 13. The substrate 11 could be made of FR-4, bismaleimide triazine(BT), and the like. Substrate 11 are extended through by metal filled vias 14, wherein one end 17 of each metal filled via 14 may terminate at surface 12 and a second end 18 of each metal filled via 14 may terminate at surface 13. Contact pads 19 are fabricated on the surface 12 and in contact with ends 17. Likewise, contact pads 21 are fabricated on the surface 13 and in contact with second ends 18. The contact pads 21 are for conducting feedouts or electrical interconnects, while the contact pads 19 are for fabricating probes 56 by electroplating, as shown in FIG. 2.

As shown in FIG. 1, the probe head 10 having a plating base 22 fabricated on the upper surface 12 and contact pads 19. Plating base 22 comprises an adhesion layer 20 and a plating seed layer 24. The adhesion layer 20 is made of titanium, chromium, and the like, whereas the plating seed layer 24 is made of gold, nickel, and the like. Then the resist layer 45 is coated on the plating base 22. In addition, a UV mask 41 and a UV radiation light source 42 are also needed. The UV radiation mask 41 comprises a thin quartz plate 43 having a patterned layer of chromium 44 disposed thereon. UV radiation is capable of traveling through the quartz plate 43 but is absorbed by chromium layer 44. Chromium layer 44 is patterned to have openings 47 through which UV radiation 48 travels and irradiates the portions of resist layer 45. A plurality of openings are fabricated, and then it was proceeded to fabricate a portion 51 of probes 56 by electroplating. The second resist layer 46 was fabricated on the first barrier layer 45 by lithography. At this time, it only needed to move the UV mask 41 according to the needed fabricate of probes 56 to fabricate openings 49 on the second barrier layer, and then again it was proceeded to fabricate a portion 52 of probes 56 by electroplating. Steps of fabricating the portions of probes 56 were repeated until probes 56 were fabricated.

FIG. 2 referred to a method to fabricate a probe card 55. While probes 56 were fabricated on the probe head 10, the barrier layer and plating base 22 were then removed to fabricate a probe card 55. Each of the probes 56 of the probe card 55 comprises the portions of 51, 52, and 53. The portions of 51, 52, and 53 were fabricated according to the hardness or conductivity of probes by electroplating metals selected from the group of nickel, gold, copper, palladium, tin, etc. Probes 56 are in stair-step shaped, and are elastic and compliant of the bonding pads on a semiconductor chip. This advantage permits to decrease the contact resistance and scrubbing on chips. Yet the manufacturing method mentioned above also has disadvantages. It needed to fabricate a barrier layer 45 by lithography before electroplating, and then to irradiate by a UV radiation source 42 and a UV mask 41. A plurality of openings were fabricated on the barrier layer 45, and then it proceeded to fabricate portion 51 of probes 56 by electroplating. The steps were repeated to fabricate portions of 52, and 53, but only simple shape such as a stair-step shaped or single angle probes 56 could be fabricated. Also there is stress concentrated in the interfaces of portions of 51, 52, and 53 while probing. The manufacturing method mentioned above needs to repeat steps such as fabrication of barrier layers, irradiation of UV, and the like until probes 56 are fabricated. It also needs to design different fabrication of UV masks according to the shapes of probes. All of these contribute to increase the manufacturing processes, time and also the costs.

SUMMARY OF THE INVENTION

The main purpose of the present invention is to offer a method for manufacturing probes of a probe card. It relates to the fabrication of probes of a probe card with random-shape by continuous electroplating on a probe head. The probes of a probe card is used to reduce contact resistance and provide good electrical contact.

The second purpose of the present invention is to offer a method for manufacturing probes of a probe card in a more cost-effective way with shorter manufacturing time. It is manufactured by electroplating on a probe head to fabricate probes in desired shapes. It does not need multiply lithography nor removing barrier layers repeatedly, and therefore it is cost-effective and the lead time of manufacturing are also reduced.

It is still another purpose of the present invention to supply a method for manufacturing probes of a probe card with good quality and uniformity. A blocking plate with openings is provided, and the contact points of a probe head contact the electroplating solution and electroplating proceed through these openings. Consequently, the probes are fabricated by continuously moving the probe head in both horizontal and vertical directions. Therefore, it is applicable to manufacture a plurality of probes with elastic and desired shapes, and with good quality and uniformity in heights and shapes.

In summary, the method mentioned above is to provide a probe head fabricated with a plurality of contact points. Preferably, the contact points of a probe head have bumps on top, and a blocking plate with a plurality of openings places on an electroplating tank. These openings are designed corresponding to the contact points of the probe head. Then the blocking plate is placed under the probe head of which the bumps on contact points contact the electroplating solution through the openings, and proceeds to fabricate probes by electroplating. Consequently, the probes may be fabricated by continuously moving the probe head in accordance with desired probe shapes.

DETAIL DESCRIPTION OF THE INVENTION

Figure 1:
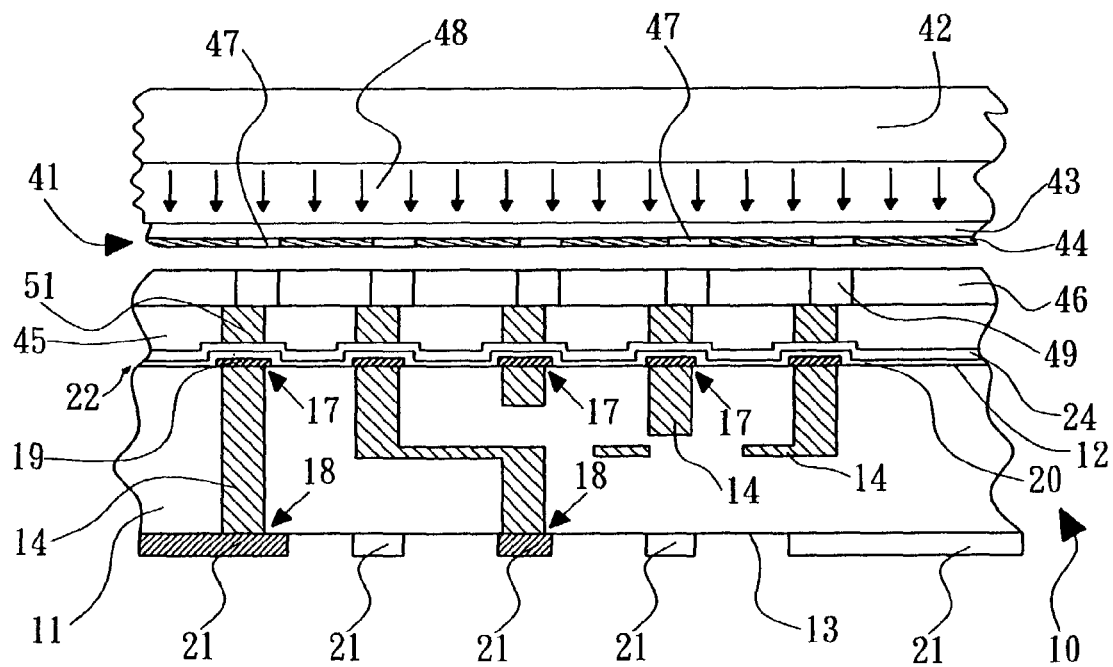
FIG. 1 is a cross section view of a probe card during irradiation step according to the U.S. Pat. No. 5,513,430 entitled "Methods of manufacturing a probe"
Figure 2:
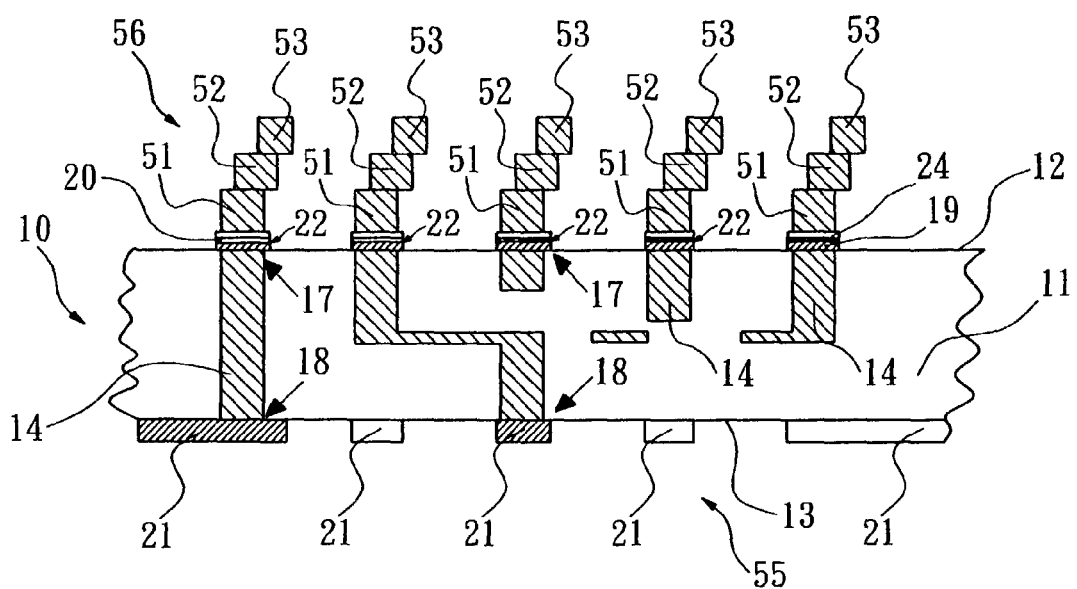
FIG. 2 is a cross section view of probes according to the U.S. Pat. No. 5,513,430 entitled "Methods of manufacturing a probe"

Please referring to the drawings attached, the present invention will be described by means of embodiments below.

Figure 3A:
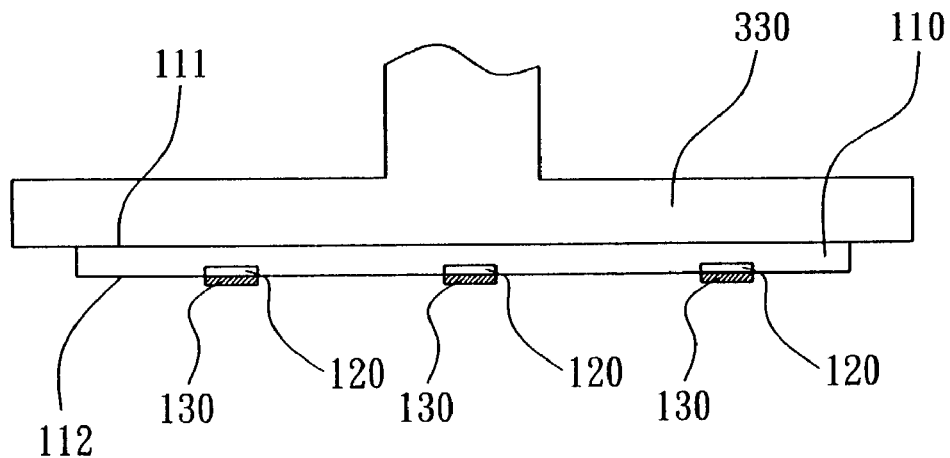
FIG. 3a is a cross-sectional view of a probe head in accordance with a first embodiment of the present invention.

The first embodiment in accordance with the present invention is shown in FIG. 3a to 3e, a cros section view of step-by-step of the manufacturing method. As shown in FIG. 3a, a probe head 110, which is made of polyimide, FR-4, BT resin, ceramics, silicon, and the like, has probing circuits fabricated within (not shown in figure). The probe head 110 also has a top surface 111 and a bottom surface 112. Wherein the top surface 111 was attached to a vacuum chuck or electrostatic chuck, whereas the bottom surface 112 has a plurality of contact pads 120. Preferably, bumps 130 were fabricated on contact pads 120 by electroplating of evaporation. Bumps 130 are used to form probes 140.

Figure 3B:
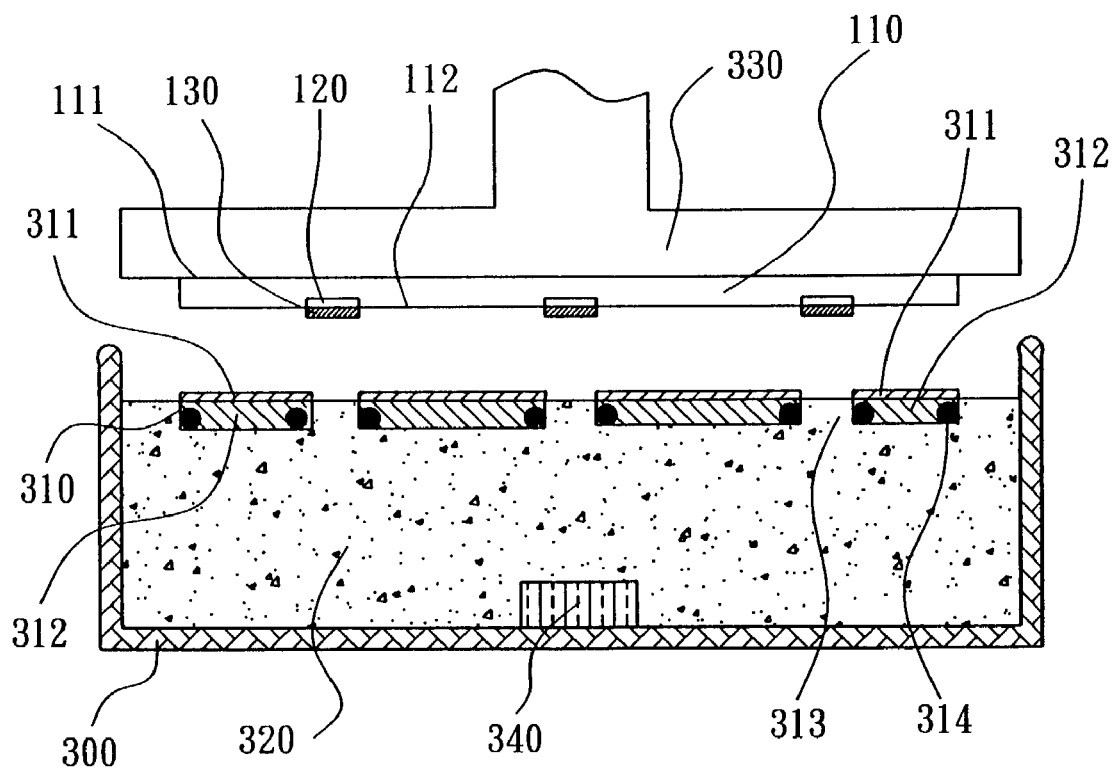
FIG. 3b is a cross section view of a probe head on an electroplating tank in accordance with the first embodiment of the present invention.

In shown in FIG. 3b, there is an insulated blocking plate 310 on top of electroplating tank 300, which can be a composite substrate, in this embodiment, blocking plate 310 is made by composite materials and has a top layer 311 and a bottom layer 312. Top layer 311 is elastic and soft which made of rubber, silica gel, etc. and the bottom layer 312 is hard and rigid which made of ceramic, plastic, glass fiber, wood, etc. The blocking plate 310 has a plurality of openings 313 through top surface 311 and bottom surface 312. The locations of these openings are designed according to the contact pads 120 on probe head 110. Preferably, there are a plurality of sensors 314 were installed at the edge of openings 313 on the bottom layer 312 of blocking plate 310. These sensors 314 are used to monitor the progress of the electroplating metal which transmit monitor signal to a controlling device (not shown in figure) to control the electroplating time of probes 140 and the moving path of probe head 110.

Figure 3C:
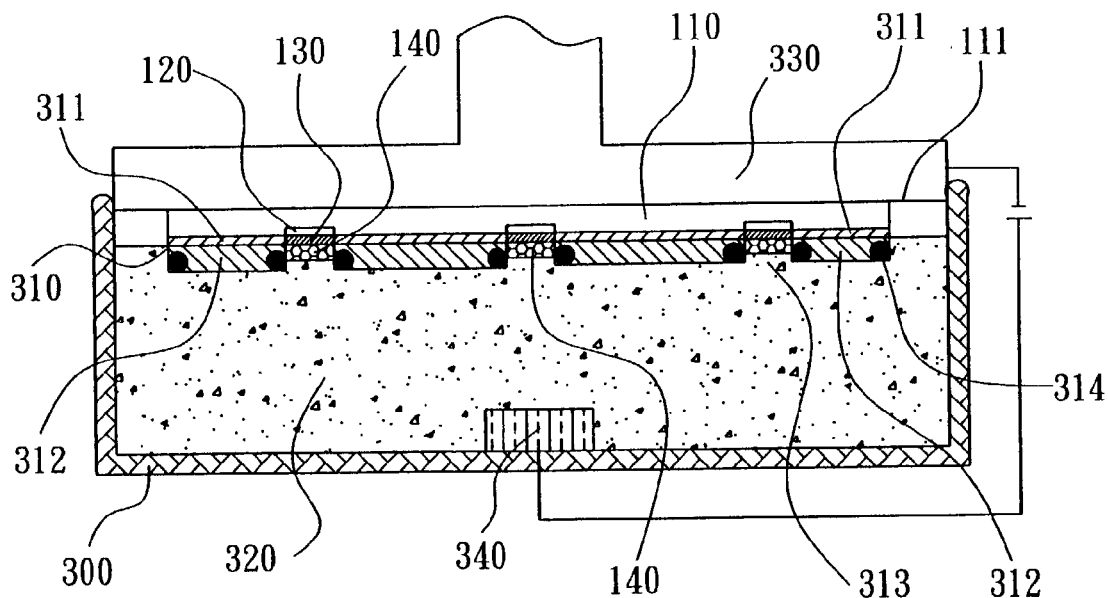
FIG. 3c is a cross section view of a probe head at the beginning of the electrical plating in accordance with the first embodiment of the present invention.

Then, as shown in FIG. 3c, the top surface 111 of probe head 110 is attached to the vacuum chuck 330 which is on top of electroplating tank 300. By lowering the probe head 110 to enable bumps 130 on contact pads 120 to contact with the electroplating solutions 320 in the electroplating tank 300 through the openings 313 of blocking plate 310, i.e., probe head 110 is placed directly on top of blocking plate 310. Preferably, the blocking plate 310 doesn't completely dip into the liquid surface of electroplating solution 320 in the electroplating tank 300. Then power is connected to the electrode 340 and probing circuits on probe head 110 (not shown) and probes begin to fabricate through electroplating processes.

Figure 3D:
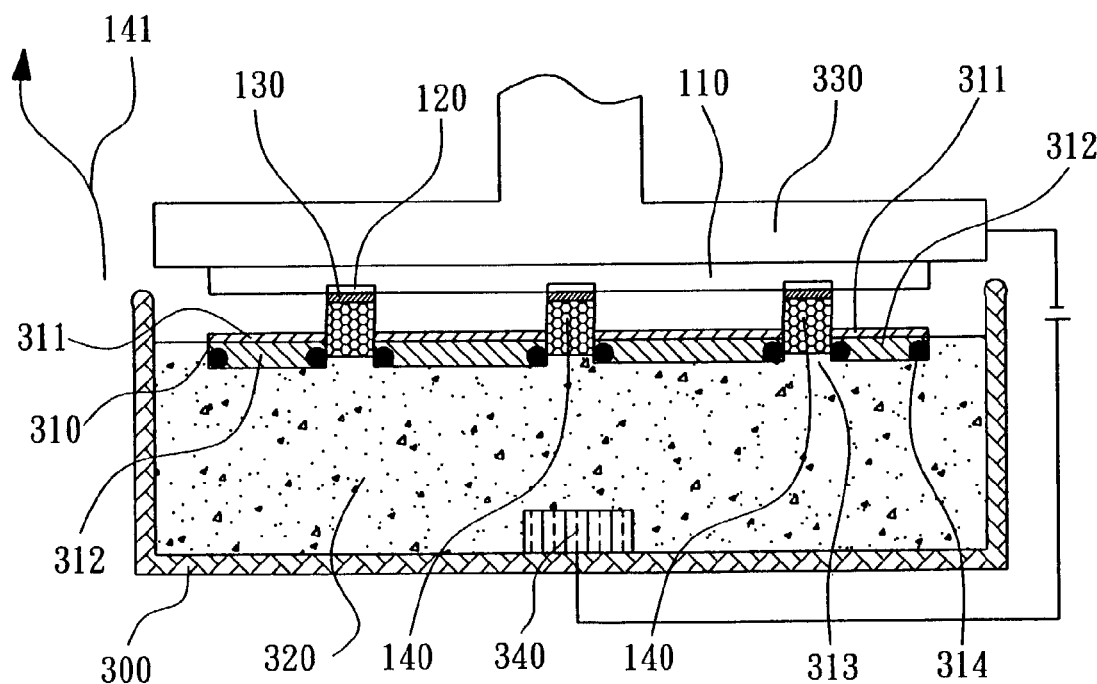
FIG. 3d is a cross section view of a probe head during the electrical plating processes in accordance with the first embodiment of the present invention.

As shown in FIG. 3d, during the processes of electroplating, the moving path for probe head 110 has been preset inside the controller. When sensor 314 in the blocking plate 310 detects that the plating thickness on probe head 110 has reached the preset position at the bottom end of opening 313 on blocking plate 310, signal was sent to the controller to move the vacuum chuck 330 up and to the left where probe head 110 was attached on vacuum chuck 330. When probe head 110 moving up and to the left as vacuum chuck 330, the probes 140 will be fabricated through electroplating in the shape of a moving path 141 (as shown in FIG. 3e).

Figure 3E:
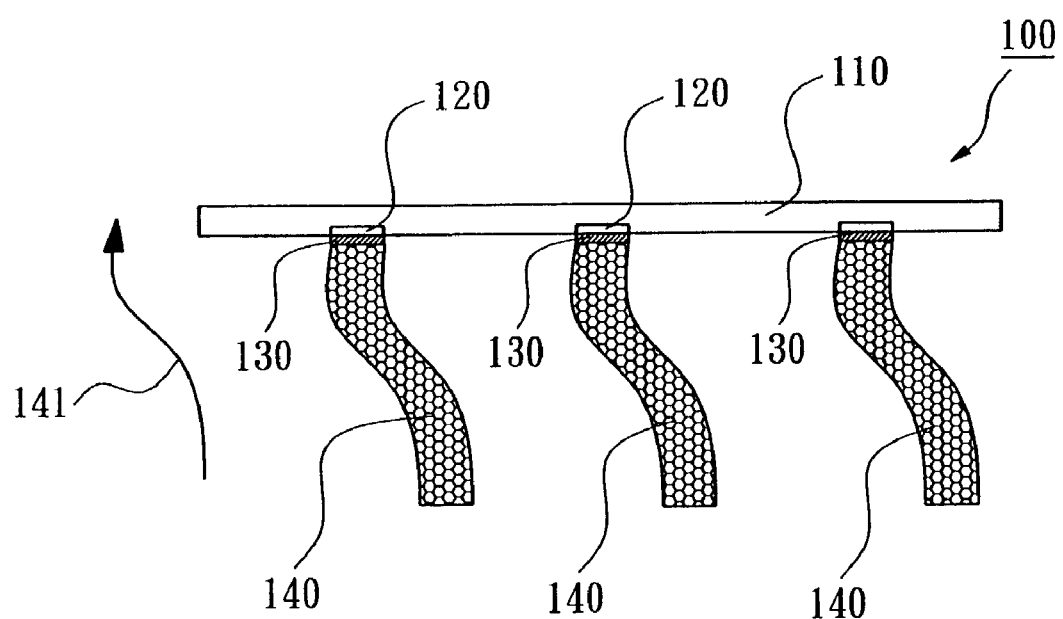
FIG. 3e is a cross section view of a probe head after the electrical plating processes in accordance with the first embodiment of the present invention.

Finally, as shown in FIG. 3e, by moving probe head 110 in a path of stretched "S" shape 141, i.e., moving probe head 110 up, to the left, and up, a plurality of probes 140 in the shape of stretched "S" will be fabricated on top of probe head 110. In the same way, different shapes of probes 140 can be fabricated through electroplating by using the electroplating processes mentioned above.

Figure 4:
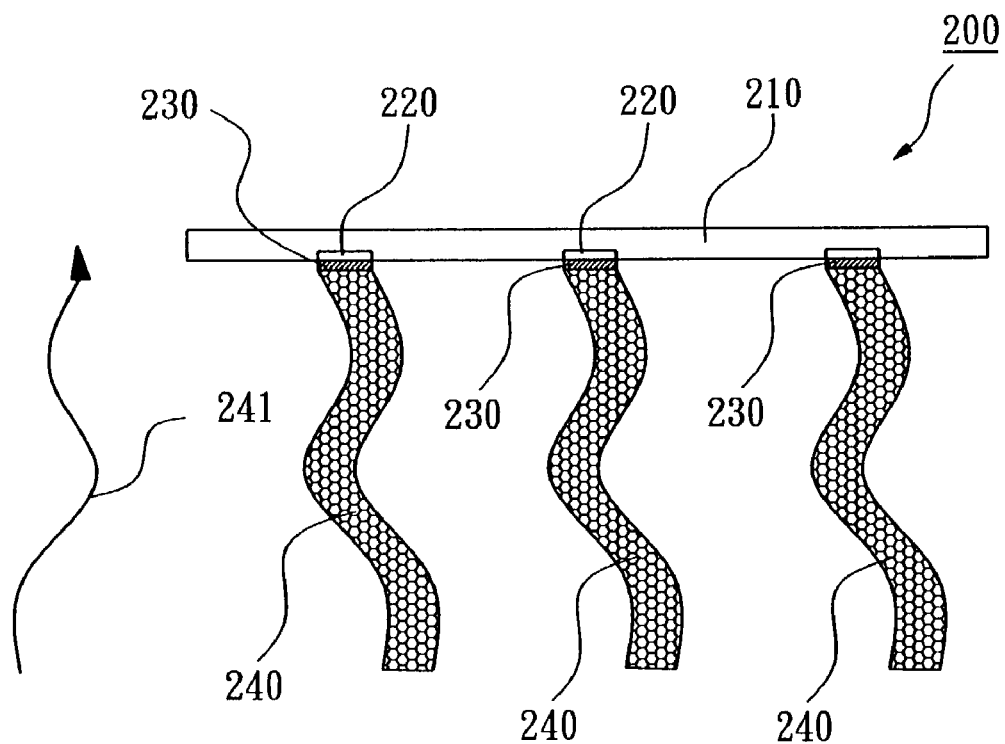
FIG. 4 is a cross section view of a probe head after the electrical plating processes in accordance with a second embodiment of the present invention.

The second embodiment of the present invention, as shown in FIG. 4, the probe head 210 has the same structure as probe head 110 in the first embodiment of the present invention. By using electroplating processes described above, probes 240 can be fabricated on top of the bumps 230 which are on top of contact pads of probe head 210. The only difference is, during electroplating processes, the moving path 241 is similar to a stretched "stacked S", i.e., probe head 210 moves up, then to the left, then to the right, then to the left again, and finally up again. Therefore, a plurality of elastic probes 240 with a shape of stretched "stacked S" can be fabricated on top of probe head 210.

According to the electroplating processes of the present invention, probes with arbitrary shapes such as S, stacked S, wave etc. can be fabricated on probe head 110, 210. Moreover, probes 140, 240 in "S", "stacked S", etc will be elastic with good uniformity in the heights and shapes, so that contact resistance can be reduced, i.e., increase the quality of contactability during wafer probing. Furthermore, during electroplating processes, the plating time of probes 140, 240 and the moving of probe head 110, 210 are all controlled by computer through transmitting signal between sensor 314 on blocking plate 310 and controller. That is, the whole electroplating processes can be in automation to save manpower for manufacturing. The probe head 110, 210 was electroplated through openings 313 on blocking plate 310. There are no multiple processes for lithography nor removing barrier layers. The electroplating processes to fabricate probes 140, 240 in the present invention can greatly reduce the processing steps, time, manpower, and cost. On top of all these, the electroplating processes in the present invention can make probes in a various shapes and forms to reduce contact resistance and provide good electrical contact during wafer probing.

The above description of embodiments of this invention is intended to be illustrative and not limiting. Other embodiments of this invention will be obvious to those skilled in the art in view of the above disclosure.

What is claimed is:

1. A method for manufacturing probes of a probe card comprising:
    providing a probe head having a plurality of contact pads;
    providing an electroplating tank with a blocking plate, wherein the blocking plate has a plurality of openings corresponding to the contact pads on the probe head, moving the probe head so that an electroplating solution in the electroplating tank contacts the contact pads on the probe head through the openings of the blocking plate for electroplating; and
    continuously moving the probe head during the electroplating according to a predetermined shape of the probes so as to form the probes on the contact pads.

2. The method according to claim 1, wherein the probe head is made from a material selected from polyimide, glass fiber, Bismaleimide triazine resin, or ceramic.

3. The method according to claim 1, wherein the blocking plate is positioned on top of the electroplating tank, and the blocking plate has a top layer and a bottom layer.

4. The method according to claim 3, wherein the top layer of the blocking plate is softer and more elastic than the bottom layer.

5. The method according to claim 1, wherein the blocking plate has sensors for monitoring a metal thickness at the edge of the openings of the blocking plate during the electroplating.

6. The method according to claim 1, wherein the probe head has a plurality of bumps on the contact pads.

* * * * *